United States Patent [19]

Inose et al.

[11] 4,051,457
[45] Sept. 27, 1977

[54] SYSTEM FOR GENERATING A CHARACTER PATTERN

[75] Inventors: Fumiyuki Inose, San Jose, Calif.; Kenji Fujikata, Hachioji; Norio Yokozawa, Fuchi, both of Japan

[73] Assignee: Hitachi, Ltd., Japan

[21] Appl. No.: 655,139

[22] Filed: Feb. 3, 1976

[30] Foreign Application Priority Data

Feb. 3, 1975  Japan ............................ 50-13430

[51] Int. Cl.$^2$ .......................................... G11C 15/00
[52] U.S. Cl. ................. 340/146.3 MA; 340/173 RC; 364/900
[58] Field of Search .......... 340/324 R, 324 M, 324 A, 340/324 AD, 173 RC, 146.3 AH, 146.3 R, 146.3 MA, 172.5, 173 AM

[56] References Cited

U.S. PATENT DOCUMENTS

| 3,559,208 | 1/1971 | DiGiugno et al. | 340/324 AD |
| 3,643,252 | 2/1972 | Roberts | 340/324 AD |
| 3,713,113 | 1/1973 | Kohzuma et al. | 340/173 RC |
| 3,737,890 | 6/1973 | Salava | 340/173 RC |
| 3,748,652 | 7/1973 | Ward et al. | 340/173 RC |

Primary Examiner—Leo H. Boudreau
Attorney, Agent, or Firm—Craig & Antonelli

[57] ABSTRACT

In a character displaying device having a character pattern memory which is made up of a circulating sequential access memory storing character patterns therein, a character pattern generating system comprises a high speed buffer memory which stores the character codes of one line or any other suitable amount of characters to be displayed and the corresponding character patterns, so that each time one character is delivered as an output from the character pattern memory, the presence of the character code of the particular character is examined for all the character codes of the buffer memory, and the character pattern of the particular character is written into the buffer memory when the character codes are coincident, the writing operations being sequentially executed in the order of the character outputs of the character pattern memory, thereby making it possible to finish all the character patterns in the buffer memory within a period in which the read-out of the character pattern memory circulates.

9 Claims, 17 Drawing Figures

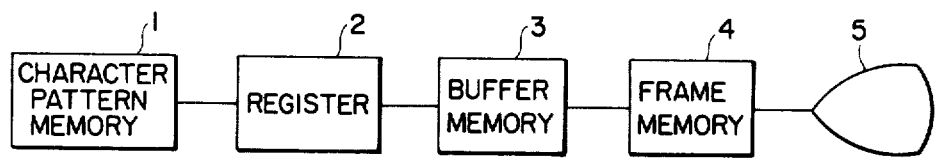
FIG. 1
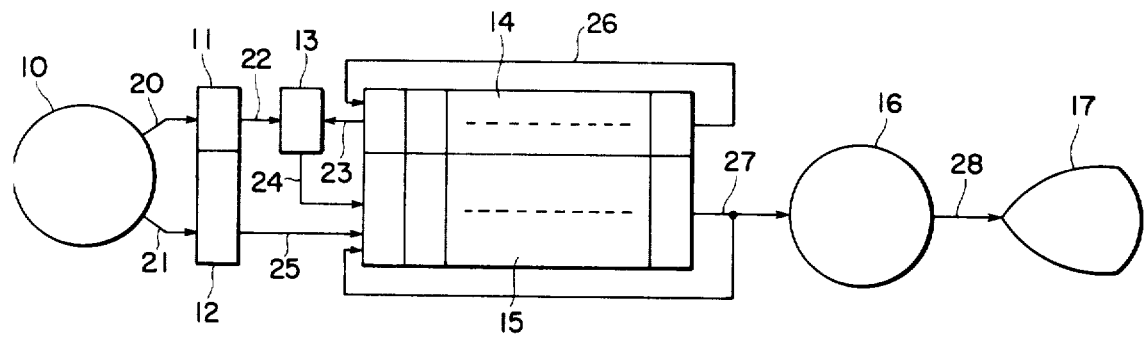
FIG. 2
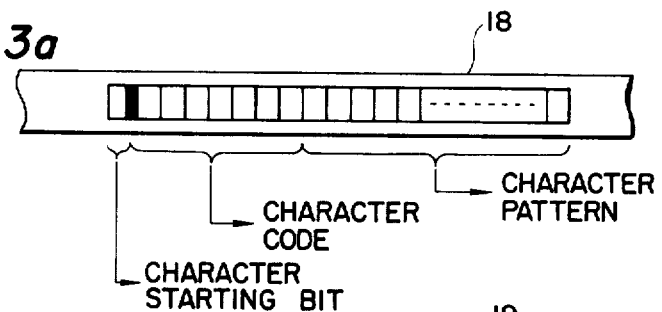
FIG. 3a
FIG. 3b
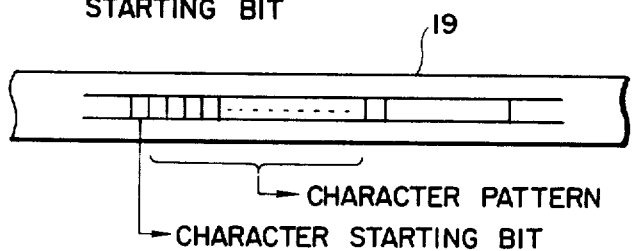
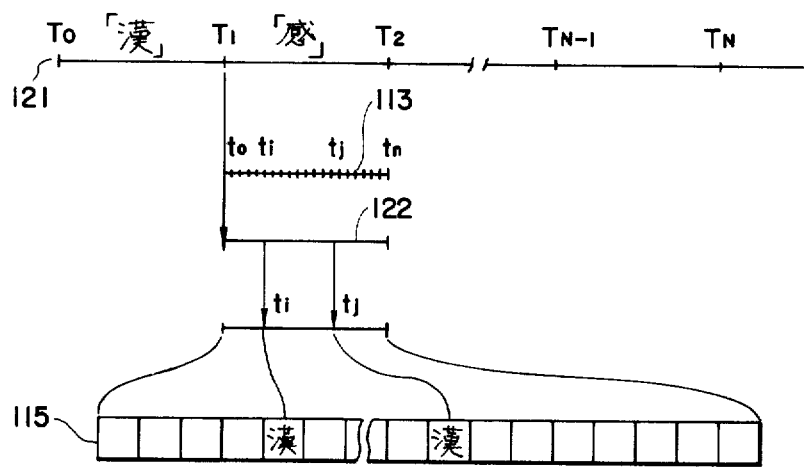
FIG. 4

FIG. 10a
| 0 | 1 | 2 | 3 | 4 | 5 | | N-1 | |
|---|---|---|---|---|---|---|---|---|
| m | m+1 | m+2 | m+3 | m+4 | m+5 | | | } SECTOR ADDRESS } CHARACTER CODE |
| l | l+1 | l+2 | l+3 | l+4 | l+5 | | | } TRACK ADDRESS |
| 漢 | 字 | 発 | 生 | 装 | 置 | | | } CHARACTER PATTERN |
FIG. 10b
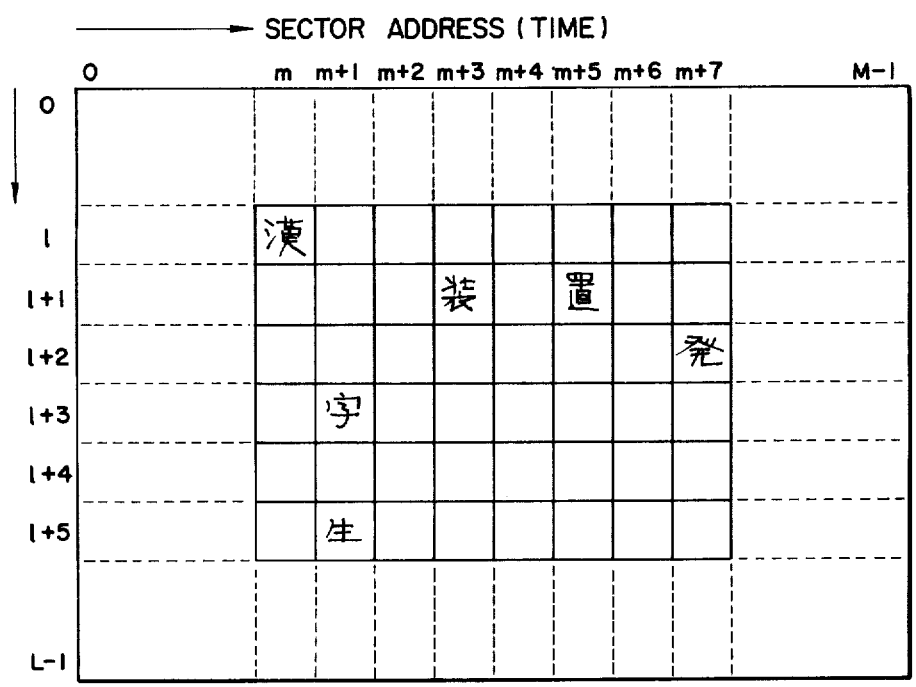
FIG. 11
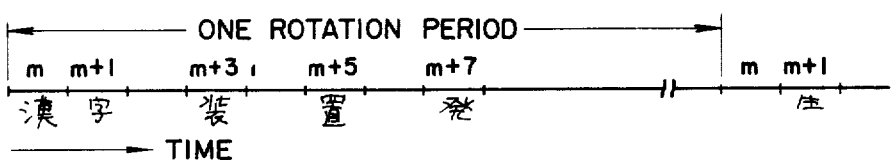

4,051,457

SYSTEM FOR GENERATING A CHARACTER PATTERN

BACKGROUND OF THE INVENTION

This invention relates to a character pattern generating system in a character displaying device which deals with many kinds of characters such as Chinese characters.

In a character displaying device, such as a Chinese character display and a Chinese character printer, which sequentially reads out necessary Chinese character patterns from a character pattern memory storing many kinds of character patterns therein and which displays them, it has heretofore been common practice that character pattern memories are accessed on the basis of character codes at every character to be displayed and that the corresponding character patterns are sequentially read out.

The prior-art device, however, has the disadvantage that where a large-capacity sequential memory such as magnetic disc memory and magnetic drum memory is used as the character pattern memory, a long access time of such a memory makes it impossible to speedily generate the character patterns to be displayed, so that the character display speed becomes low.

Where a random access memory such as a core memory and a semiconductor memory is used as the character pattern memory, no problem is involved in rendering the character display speedy. Disadvantageously, however, the device becomes very expensive and is impractical.

SUMMARY OF THE INVENTION

An object of this invention is to provide a character pattern generating system which is extraordinarily low in cost and high in speed.

In order to accomplish such an object, this invention employs a circulating sequential access memory as a character pattern memory, and disposes a high-speed buffer memory for storing character codes as well as character patterns corresponding to a series of characters to be displayed and a coincidence circuit for examining the coincidence between a character code of a character read out from the character pattern memory and each character code of the high-speed buffer memory, so that each time one character is read out from the character pattern memory, whether or not the corresponding character code exists in the buffer memory is examined by the coincidence circuit, and if the coincident character code exists, the character pattern from the character pattern memory is written into the corresponding position of the buffer memory, the writing operations being sequentially executed in the order of the read-out of the character pattern memory.

BRIEF DESCRIPTION OF THE DRAWINGS

FIG. 1 is a block diagram for explaining the principle of this invention.

FIG. 2 is a block diagram of an embodiment of the character pattern generating system according to this invention.

FIGS. 3a and 3b are diagrams each of which shows an example of the bit construction of each track of a circulating sequential access memory according to this invention.

FIG. 4 is a time chart for explaining the operation of the embodiment in FIG. 2.

FIGS. 10a and 10b are diagrams which show an example of the construction of a memory in FIG. 9.

FIG. 11 is a time chart for explaining the read-out state of the memory in FIGS. 10a and 10b.

DETAILED DESCRIPTION OF THE PREFERRED EMBODIMENTS

Figure 5A:
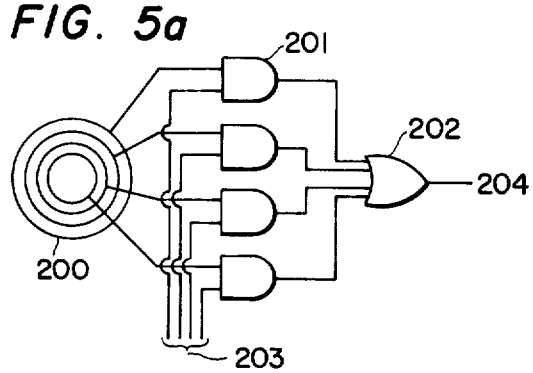
FIGS. 5a to 5c are diagrams each of which shows an example of a read-out circuit in the case where a plurality of tracks are used as a character pattern memory.

FIG. 1 is a diagram showing the principle of this invention.

In the figure, numeral 1 designates a character pattern memory which stores many kinds of character patterns therein. It is constructed of a circulating sequential access memory which repeatedly provides the character patterns as outputs.

As the circulating sequential memory, there may be used a magnetic or optical disc memory, a magnetic or optical drum memory, an electrical or magnetic large-capacity shift register, or a magnetic or optical endless tape.

Shown at 2 is a register which, each time one character is read out from the character pattern memory 1, holds the code and pattern thereof. A high-speed buffer memory 3 stores the codes and patterns of a series of characters to be displayed, and has a capacity which corresponds to n of the series of characters to be displayed. A pattern memory 4 is used as a frame memory for display, and has a capacity corresponding to one frame of characters. A display device, such as cathode ray tube (CRT), 5 repeatedly reads out character patterns from the frame memory 4 and displays them. The operations of the system according to this invention are listed below.

1. The codes of the characters to be displayed which correspond to n characters are set in the buffer memory 3 in the sequence of the display. The sequence can be indicated by an electronic computer or a human being.

2. Each time one character pattern is read out from the character pattern memory 1, the character code and the character pattern are stored in the register 2. The character code is sequentially compared with the character codes of the buffer memory 3, and in cases of coincidence, the character pattern of the register 2 is set in the buffer memory 3. The character code comparison operation is executed for all the character codes of the buffer memory 3.

3. By repeatedly performing the operation (2) each time the character is read out from the character pattern memory 1, a character pattern array corresponding to n characters is completed in the buffer memory 3 at the time when the read-out of the character pattern memory has circulated.

4. The character patterns corresponding to n characters are transferred from the buffer memory 3 to the frame memory 4 and recorded therein.

5. The operations (1) to (4) are repeated until one frame is completed. The characters corresponding to one frame as thus recorded in the frame memory 4 are displayed on the display device, such as CRT, 5.

In this way, with the system according to the present invention, the character pattern generation corresponding to n characters can be executed in the period of the circulation of the character pattern memory, and a high-speed character display becomes possible. n is determined by the speed of the buffer memory, the required display speed, etc., and it may amount to below or above one line or to the capacity of the whole frame.

In case of, for example, a Chinese character printer, the character patterns of the buffer memory 3 can be delivered directly to the printer, and the frame memory 4 can be omitted. Accordingly, the steps (4) and (5) become unnecessary.

FIG. 2 shows an embodiment according to this invention. Numeral 10 denotes a character pattern memory which is made up of a circulating sequential access memory. Numerals 11 and 12 denote registers in which the code and pattern of each character read out from the character pattern memory 1 are set, respectively. A comparator circuit 13 examines the coincidence between the character code of the register 11 and that of a buffer memory to be described below. Numerals 14 and 15 represent buffer memories which store the codes of n characters to be displayed and the corresponding patterns in the sequence of the display, respectively. Numeral 16 designates a frame memory which stores the character patterns of the buffer memory 15, while numeral 17 designates a CRT display device which displays the contents of the frame memory 16.

Description will now be made of a case where a magnetic disc is employed as the character pattern memory 10, shift registers each having a capacity of one line of display characters are employed as the buffer memories 14 and 15, and a magnetic disc is employed as the frame memory 16. Here, the shift registers 14 and 15 are so constructed that every bit is shifted in series or that, in order to raise the transfer speed, several bits are shifted in parallel as may be needed. The operations are carried out as explained below. The character pattern memory 10 may also be a magnetic drum.

a. On each track of the magnetic disc 10, a character pattern (consisting of, for example, 16 × 16 bits) is recorded along with a character code (consisting of, for example, 10 bits) as illustrated in FIG. 3a. Numeral 18 indicates one track of the disc 10.

The character code and the character pattern are respectively set in the code register 11 and the pattern register 12 by a pulse generated by a character starting bit. As shown in FIG. 3b. a method may be adopted in which the character code is not stored on a track 19, but the number of character starting bits is counted by a counter and the count value is made the character code. In this case, the value of the counter is set in the code register 11.

b. The buffer memories corresponding to one line consist of the code buffer 14 and the pattern buffer 15. By circulating the respective outputs 26 and 27 to the inputs, circulating shift registers are constructed. Both the buffers 14 and 15 shift the contents at the same time. In the code buffer 14, the character codes to be displayed as correspond to one line are set beforehand in the order of the display.

c. A character code 20 and a character pattern 21 from the magnetic disc 10 are respectively received as inputs into the registers 11 and 12. When the code register 11 is renewed, the shifts of the buffer memories 14 and 15 corresponding to one line are initiated. The code comparator circuit 13 compares a code 22 of the code register 11 and respective codes 23 of the code buffer 14. In the case of coincidence, a character pattern 25 of the pattern register 12 is written into the corresponding position of the pattern buffer 15 by a coincidence signal 24.

d. Each time the code register 11 is renewed, the pattern, if any, is written into the buffer register 15 corresponding to one line. Then, during the period during which the magnetic disc 10 executes one revolution, the character patterns corresponding to one line are finished in the pattern buffer 15. The character patterns thus obtained are written into the frame memory 16 at timings corresponding to display positions. Further, they are fed to the CRT 17 as a video signal 28, and the renewed characters for one line are displayed thereon.

e. The code buffer 14 is subsequently renewed for characters to be displayed in the next line, and the operations (c) and (d) are executed. Thus, characters for one frame are renewed on the CRT 17. Where one frame consists of L lines, the renewal is completed while the magnetic disc 10 executes L revolutions.

In the case of applying this invention to printing etc., when all the contents of the pattern buffer 15 have been written, the patterns for one line are completed, and the foregoing step (d) is thus terminated. A printer may be operated for one line upon the termination, and the foregoing step (e) is not always necessary.

FIG. 4 is a time chart of the operation in FIG. 2. It is assumed that the magnetic disc 10 for the character pattern memory stores therein N kinds of character patterns each consisting of p vertical dots × q horizontal dots, and that the buffer memories 14 and 15 have a capacity of n characters for one line. N character patterns are delivered as outputs from the character pattern memory 10 in a time interval $T_O - T_N$, with $(T_N - T_O)$ equal to a period. The bit rate is:

$$\frac{N \times p \times q}{T_N - T_O} \quad (1)$$

By way of example, a particular pattern which is delivered at a time interval $T_O - T_1$ as illustrated at 121 in FIG. 4 will be considered. The character pattern of $p \times q$ dots read out in series from the magnetic disc has been transferred to the pattern register 12 at a time $T_1$, and it is held for time interval $T_1 - T_2$ as illustrated at 122. Simultaneously therewith, the code register 11 is renewed to a character code corresponding to the particular character pattern. Subsequently, each time the contents of the code buffer 14 and the pattern buffer 15 are shifted by timings 113 of $t_0, t_1, t_n$ within the time interval $T_1 - T_2$, the output 22 of the code register 11 and the output 23 of the code buffer 14 are compared by the code comparator circuit 13. In case of coincidence, the coincidence signal 24 is provided as an output. The comparator circuit 13 can be constructed of a logical circuit of the exclusive OR logic or of subtraction etc. The required period of time per character is:

$$\frac{t_n - t_o}{n} \quad (2)$$

Where the code corresponding to the particular character pattern in question exists at the i-th and j-th positions of the code buffer 14, the character pattern is transferred from the pattern register 12 to the pattern buffer 15 at timings $t_i$ and $t_j$. The contents of the pattern buffer 15 in this case are such that a place corresponding to the particular character pattern, i. e., the i-th and j-th positions are filled up with the character pattern as illustrated at 115. In this way, each time the code register 11 and the pattern register 12 are renewed, the pattern buffer 15 is filled. Then, the filling of the pattern buffer 15 with the character patterns is completed during the time interval $T_N - T_O$. Now, assume that one period of the magnetic disc 10 is $T_N - T_O (= 50$ ms) and suppose a pattern memory accommodates N (= 1000) character patterns each consisting of $p \times q (= 16$ dots $\times$ 16 dots), as well as a pattern buffer of $n$ (= 20) characters for one line. Then, the bit rate of Eq. (1) becomes 5.12 megabits/second, which is a value easily realizable with a conventional magnetic disc.

The transfer speed at this time becomes 20,000 characters/sec. When the operation time of the comparator circuit $(t_n - t_o)$ in Eq. (2) is set at the same time length as $$\frac{T_N - T_O}{N},$$

it becomes 2.5 microsecond. This is a period of time sufficient for transfer if 256 bits of the character pattern having coincided upon the comparison of the character codes are transferred in parallel.

Needless to say, although not shown in the drawing, a register for temporarily storing the character codes as well as character patterns read out in series from the magnetic disc 10 and for shifting the contents to the registers 11 and 12 upon completion of the read-out of one character must be interposed between the magnetic disc 10 and the registers 11 and 12.

In order to write the character pattern of the buffer memory 15 into the frame memory 16 at a timing buffer memory must be connected between the buffer memory 15 and the frame memory 16.

However, it is unnecessary where the contents of the buffer memory 15 are directly printed.

The spirit of this invention resides in that, where a circulating sequential access memory is employed as a read-only character pattern memory, the presence of a character to be displayed or printed is examined in accordance with the time sequence of characters provided as outputs from the memory. Therefore, the following aspects of performance are also converted within the present invention: (A) By using a plurality of tracks of a magnetic disc or magnetic drum, the number of accommodated characters is large, or the character output speed is increased.

(B) As the character pattern memory, there may be used any circulating sequential memory in addition to the magnetic disc and the magnetic drum, for example, a shift register such as charge coupled device (CCD) and a bucket brigade device (BBD), or a magnetic bubble memory. Further, these devices are used in parallel so as to increase the speed. Alternatively, there may be employed a holographic memory disc which has a sequential read-out mechanism or a photographic disc on which codes corresponding to character patterns are directly recorded.

(C) The code register 11 and pattern register 12 for the character pattern memory, the code comparator circuit 13, the buffer memories 14, 15 or the like are divided or a plurality of such constituents are provided, and they are used in parallel, whereby the speed of comparison or transfer is increased.

(D) The buffer memories 14, 15 are constructed of exclusive registers, and code comparator circuits are provided in correspondence with the respective characters of the buffer memory, whereby the code comparisons of the buffer memory and the character pattern renewal in the case of the coincident codes are performed for the entire buffer memory at the same time.

(E) As the frame memory 16, there may be employed a magnetic drum, a silicon target storage tube, a shift register or the like other than the magnetic disc. A large number of sets consisting of the frame memory 16 and the CRT display device 17 are provided, thereby making it possible to display characters in parallel.

Figure 5B:
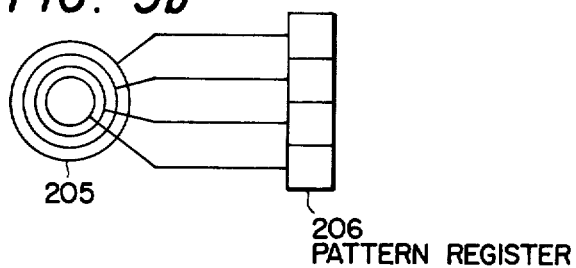
Figure 5C:
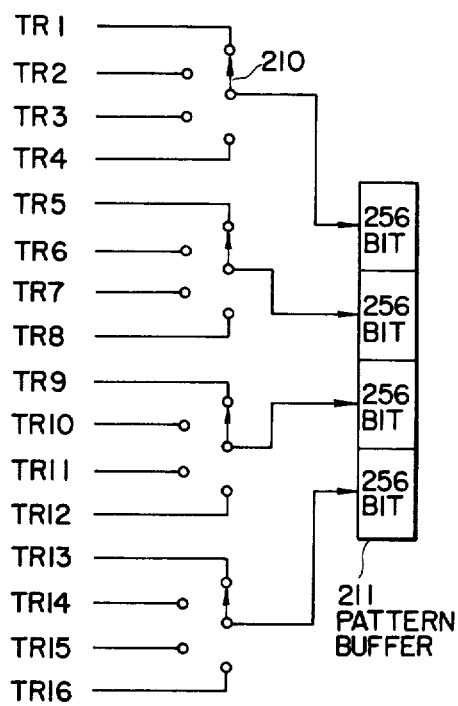

Embodiments corresponding to the aspect of performance (A) are illustrated in FIGS. 5a - 5c.

In FIG. 5a, character patterns which are independently recorded on a plurality of, for example four tracks 200 are read out by selecting them by means of logical gates 201 disposed at every track and a logical gate 202.

By sequentially applying positive logic signals 203 to the gate 201 at every revolution, the character patterns of the respective tracks are sequentially derived as outputs 204, and they are stored in the code and pattern registers. By applying a positive logic signal to either of the gates 201 at every part of the track, the character pattern of any desired track can be selectively derived as the output 204.

This method makes the accommodation of many characters possible.

FIG. 5b shows a method in which characters are dividedly stored on a plurality of, for example, four tracks 205. The characters are read out in parallel, and a character pattern for one character is acquired in a pattern register 206. The read-out time of one character can be reduced to, for example, ¼.

FIG. 5c shows a construction with the expedients of FIGS. 5a and 5b combined. Description will be made of a case of accommodating character patterns of N = 4000 characters, with the bit construction of one character being $p \times q = 32 \times 32$. Sixteen tracks TR1-TR16 have exclusive heads, respectively. Character patterns recorded thereon can be read out in parallel at every set of four tracks (four read-out amplifiers are comprised), and they are sequentially changed-over by a switch 210 (diode switch) each time the disc completes one revolution.

Figure 6:
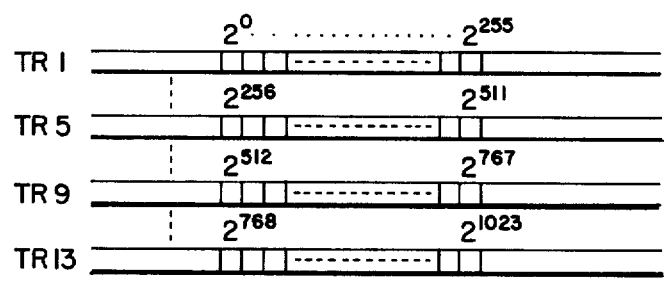
FIG. 6 is a diagram which shows the bit construction of each track in the case of FIG. 5c.

Now, note is taken of one character. As is illustrated in FIG. 6, patterns are recorded in parallel on four tracks TR1, TR5, TR9 and TR13 each including 256 bits, and the patterns of 1024 bits can be obtained in parallel in a pattern buffer 211. Accordingly, assuming one revolutional period of the disc to be 50 ms, the character patterns of 4000 characters can be delivered as outputs in a time interval of four revolutions equal to 200 ms. The bit rate of each track is 5.12 megaHz, which is a value easily realizable.

Figure 7:
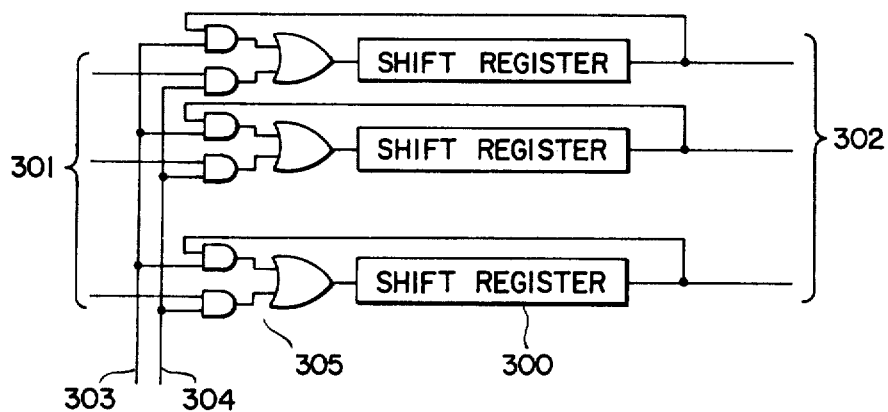
FIG. 7 is a block diagram of an embodiment of the circulating sequential memory according to this invention.

An embodiment corresponding to the aspect of performance (B), is shown in FIG. 7. Numeral 300 designates a character pattern memory which is composed of M shift registers on N bits and which can store N kinds of character patterns including M bits per character. Usually, an input 303 is formed of positive logic, while an input 304 is formed of negative logic. A shift register output 302 is circulated through a logical gatel 305 to the input side, so that a circulating shift register is formed. Each time one bit is shifted, the character pattern output 302 is renewed. By making the input 303 of negative logic and the input 304 of positive logic, character patterns can be applied from an input 301 through the logical gate 305 to the shift register 300, and the sorts of the character patterns can be altered.

While a device of the embodiment illustrated in FIG. 7 reads out the contents of the plurality of shift registers and thus achieves a high-speed operation, it corresponds to FIG. 5b of the explanatory diagram in the case of the magnetic disc. It is also possible to conversely selectively read out the contents of the plurality of shift registers as illustrated in FIGS. 5a and 5c.

Further, as a form corresponding to the case of the disc of one track, it is also possible to sequentially read out contents by the use of a single shift register of large capacity.

Figure 8:
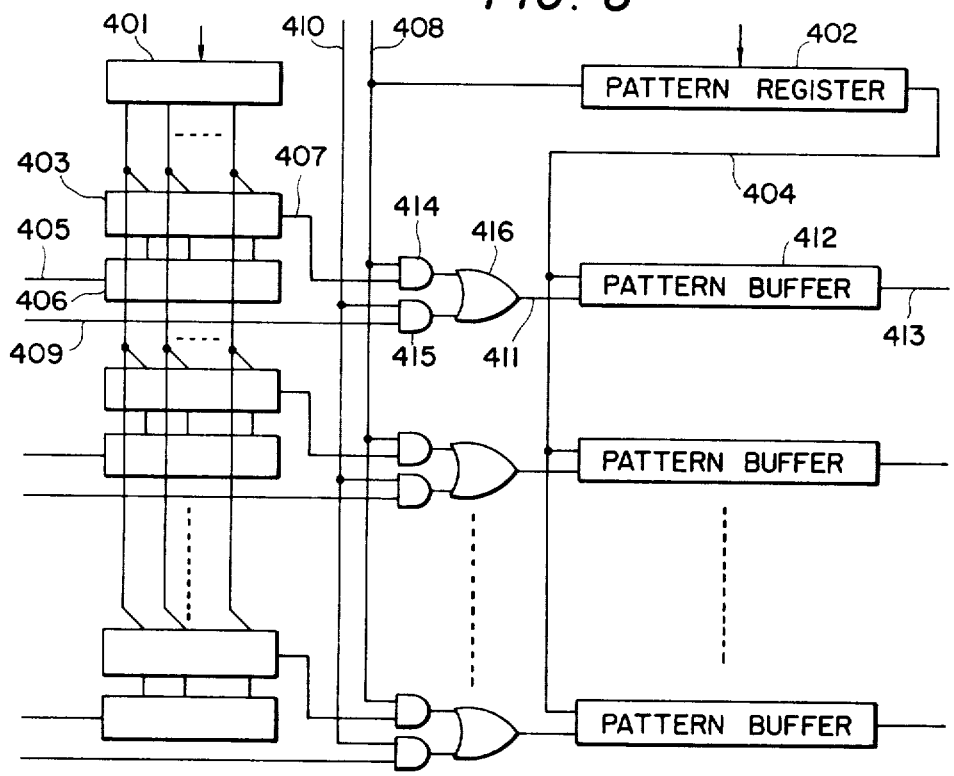
FIG. 8 is a block diagram of another embodiment of the character pattern generating system according to this invention.

An embodiment corresponding to the aspect of performance (D) is illustrated in FIG. 8. Numeral 401 indicates a register which stores the codes of characters read out from a character pattern memory and which should desirably be one adapted to deliver the character codes as outputs in parallel. Numeral 402 denotes a register which stores the patterns of the characters read out from the character pattern memory and which delivers outputs by shifting. In order to enhance the operating speed, however, parallel processing is more desirable.

Numeral 403 designates a code comparator circuit, 406 a code buffer, 412 a pattern buffer, 414 and 415 AND gates, and 416 an OR gate. Every $n$ such circuits 403, 406, 412, and 414 – 416 (corresponding to $n$ characters to be displayed) are provided.

The operation of the embodiment in FIG. 8 will be explained as to only one character of the buffer memory. The codes of characters intended to be displayed are set in the code buffer 406 by a shift input 405 in advance. When the code register 401 is renewed, the code comparator circuit 403 compares the contents of the code buffer 406 with those of the code register 401. In the case of coincidence, a coincidence output 407 is formed of positive logic. Subsequently, a pattern input clock signal 408 is applied to actuate the pattern register 402 and to transfer its output to the pattern buffer 412.

The pattern buffer 412 is a shift register. Where the coincidence output 407 is formed of positive logic, a shift clock 411 is applied through gates 414 and 416 to the pattern buffer 412, and the pattern buffer 412 receives an output 404 of the pattern register 402 by the use of the shift clock 411. Where the codes do not coincide and the coincidence output 407 is formed of negative logic, the pattern buffer 412 is not actuated.

By simultaneously performing the above operations for the other buffer memories, it is possible to execute the character pattern renewals of all the pattern buffers in parallel at the same time.

In the case of delivering the character patterns of the pattern buffer 412 as outputs, a column select signal 409 of the pattern buffer is formed of positive logic, and a pattern output clock signal 410 is applied through the gates 415 and 416 to the pattern buffer 412. Thus, the character pattern is obtained as the output 413. The same applies to the other pattern buffers, and the character patterns can be sequentially delivered as outputs.

While, in the case of the hologram memory disc or the photographic disc in the aspect of performance (B), the character may be indicated by bits of $p \times q$ dots (digital memory type), it is simpler to adopt a hologram or a photograph in which an ordinary character pattern is directly recorded. In this case, the corresponding codes should desirably be described in digital coded though this is natural.

It is to be understood that such optical recording may be effected, not only on the disc, but also on a drum.

Still another embodiment of this invention will now be described in detail with reference to FIGS. 9 – 13.

This embodiment is a system for generating character patterns at a higher speed in a circulating sequential access memory which cannot be read out data in parallel from a plurality of tracks of a magnetic disc, a magnetic drum or the like but which can be read out data from any desired tracks.

The principle of the embodiment will be explained with reference to FIGS. 10 and 11. FIG. 10a shows an example of the construction of a character code buffer memory and a character pattern buffer memory. They serve to store given character codes and character patterns corresponding thereto. The character code is defined by the combination between a track address and a sector address of the circulating sequential memory. FIG. 10b illustrates the state of information read out from a plurality of tracks of the circulating sequential memory. With the lapse of time, the sector address is successively renewed. At a certain sector address, the track address is further designated. Thus, the changeover of a magnetic head is electrically effected at a high speed, and the desired character pattern can be read out.

The operation proceeds as follows:

1. Required character codes are written into the character code buffer memory.

2. Each time the sector address is provided as an output from the circulating sequential memory. It is compared with a sector address portion for the entire character code buffer memory. In the presence of a coincident character code, a track is selected by the use of a track address portion of the character code. In this way, a character pattern corresponding to the character code can be read out from the sequential memory. There are some methods for writing character patterns into the character pattern buffer memory. For example, the character patterns are written as soon as they have been readout. In another method, which will be discussed later, when the comparison of the next sector address is being executed for the character code buffer memory, the comparison of the character code having been already read is concurrently carried out, and in case of coincidence, the character pattern is written.

3. By performing the operation (2) each time the sector address is renewed, the character patterns can be written into the entire character pattern buffer memory while the sequential memory executes one revolution and the sector addresses are circulated. However, where there are a plurality of character codes written in the character code buffer memory as are identical in the sector address portion and as differ in the track address portion, the character pattern need be read out at every character because usually the different tracks cannot be selected at the same time. In such a case, it is sometimes impossible to complete the writing of the character pattern buffer memory within the time of one revolution. A period of time of several revolutions equal to the number of overlaps is required. Since such a case rarely occurs, it does not create a problem in practical use. If necessary, however, this inconvenience can be solved in such a way that a plurality of read-out circuits for the sequential memory are provided so as to make it possible to concurrently read out a plurality of tracks.

FIG. 11 is a time chart of the operations explained above. For example, when the sector address is $m$, a corresponding character is selected. When the sector address is $m + 1$, a different character is selected. The selected character is written into the character pattern buffer memory. Another character corresponding to the sector address $m + 1$ is provided as an output and written into the character pattern buffer memory when the sector address after one revolution becomes $m + 1$. At and after the sector address $m + 2$, requested characters do not overlap in the same sector, so that the characters can be selected by the first one revolution.

Where the necessary characters overlap in the same sector, the priority level of the selection may be the order in which they are stored in the character code buffer memory. Conversely, the priority level may be from the character lastly stored in the buffer memory.

Where a plurality of identical character codes exist in the character code buffer memory, the request of the plurality of identical characters can be complied with through only one time of character pattern read-out by executing an operation to be described below each time the sector address is renewed. That is, the character patterns read out are stored, the corresponding character codes are sequentially compared with the contents of the character code buffer memory, and in the case of coincidence, the character pattern is written into the character pattern buffer memory.

Figure 9:
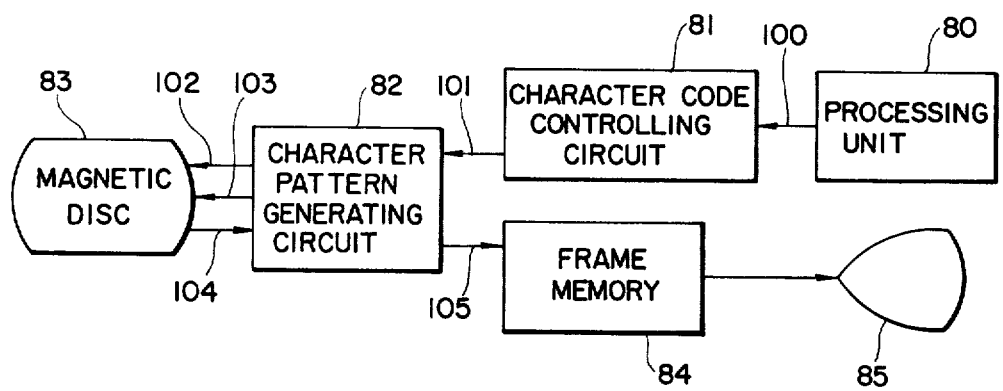
FIG. 9 is a block diagram for explaining the outline of still another embodiment of the character pattern generating system according to this invention.

FIG. 9 shows the schematic construction of an embodiment which utilizes the above principle. Character patterns which correspond to character codes delivered as outputs from a processor such as computer are read out from a circulating sequential access memory, and are displayed on a display device.

In FIG. 9, numeral 80 represents the processor which designates the code of a character to be displayed, numeral 81 a character code control circuit which converts the character code received from the processor 80 into a combination of a sector address and a track address, numeral 82 a character pattern generating apparatus which includes a buffer memory, numeral 83 a magnetic disc as a character pattern memory, numeral 84 a frame memory, and numeral 85 a CRT display device.

The magnetic disc 83 may be replaced with a magnetic drum.

First, a character code 100 intended to be displayed is delivered as an output from the processor 80. Then, the character code control circuit 81 converts the character code into the combination of a sector address and a track address. Such converted character codes 101 for $n$ characters, e.g., for one line are fed to the character pattern generating apparatus 82. The character pattern generating apparatus 82 takes in character patterns 104 corresponding to the character codes from the magnetic disc 83, and when the character patterns for one line are completed, it writes character patterns 105 into the frame memory 84. By sequentially writing the character patterns into the frame memory 84 in this manner, character patterns for one frame are acquired and can be refresh-displayed on the CRT 85.

In the present embodiment, the character patterns shall be expressed by dot information. The character patterns are recorded in the frame memory 84 in the form of video signals expressed by dots. A display unit for video signals is used for the CRT 85. However, even in case where the character patterns are expressed by another type, for example, by the type of vectors representative of strokes, the same construction can be adopted by additionally providing before the frame memory 84 a simple logical circuit which converts the stroke into the form of a video signal. When a storage display tube is used in lieu of the frame memory 84 as well as the CRT 85, the character patterns of the vectorial type can be directly recorded and displayed on the tube.

When the embodiment is applied to a printer of one line unit etc., not to the CRT display, the frame memory is not always necessary, and the character pattern generating apparatus 82 may be connected directly to the printer.

Figure 12:
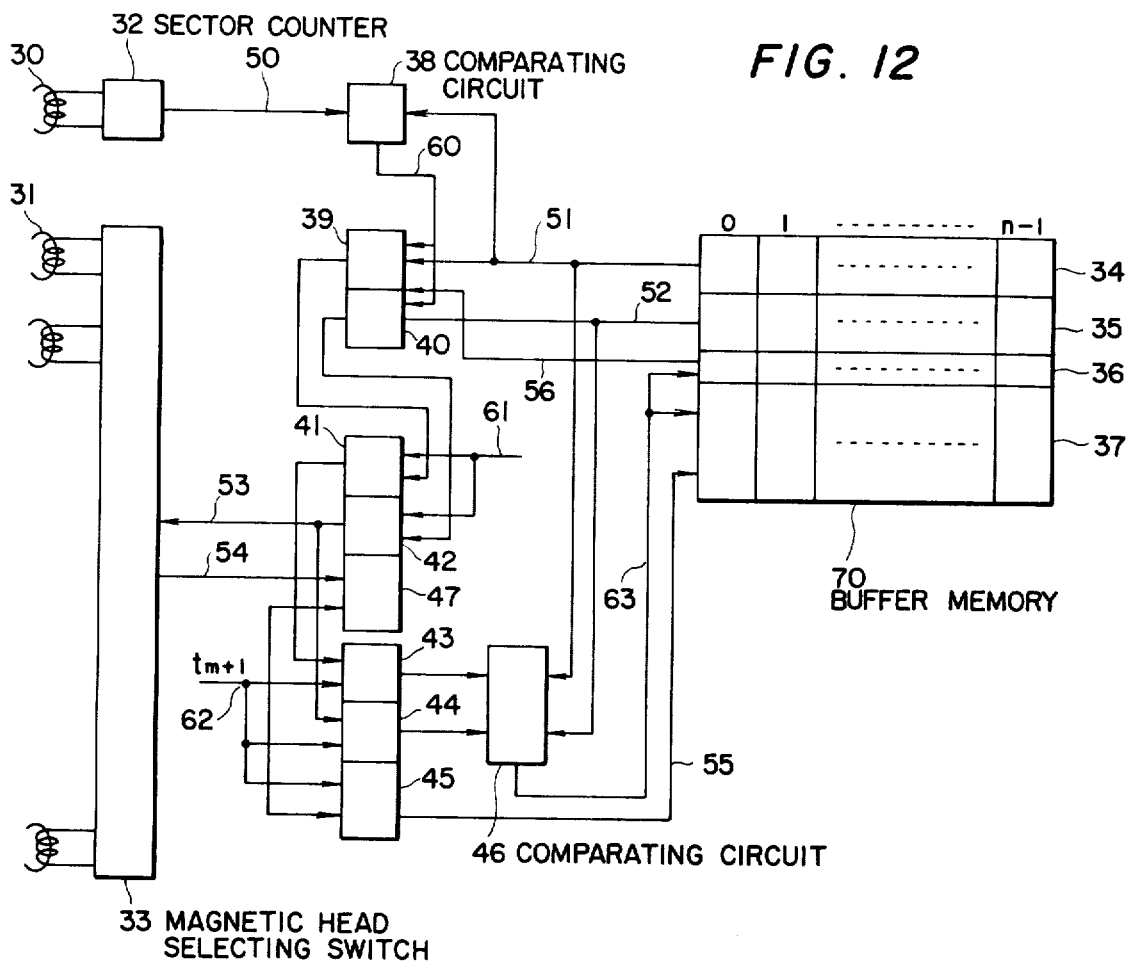
FIG. 12 is a block diagram which shows an example of the concrete construction of a part in FIG. 9.

FIG. 12 shows an embodiment which is a concrete form of the character pattern generating apparatus 82 in FIG. 9. Numeral 30 indicates a magnetic head for detecting the sector address of a magnetic disc or magnetic drum. It provides as an ouput 50 a sector address preceding by one address by means of a sector counter 32. Numeral 31 designates a magnetic head which is mounted on every track, and which is electrically switched at a high speed by a magnetic head selecting switch 33 in accordance with a track address 53. Shown at 70 is a buffer memory $n$ characters (for example, for one line), in which character codes consisting of a sector address portion 34 and a track address portion 35 are accumulated. Character patterns corresponding to the character codes can be accommodated in a character pattern buffer memory 37. Numeral 36 denotes a write completion-designating bit memory. The buffer memory 70 for $n$ characters is constructed of a circulating shift register, and the period of circulation is one sector read-out time (sector period). Numerals 38 and 46 represent comparator circuits, and numerals 39 – 45 and 47 registers.

Figure 13:
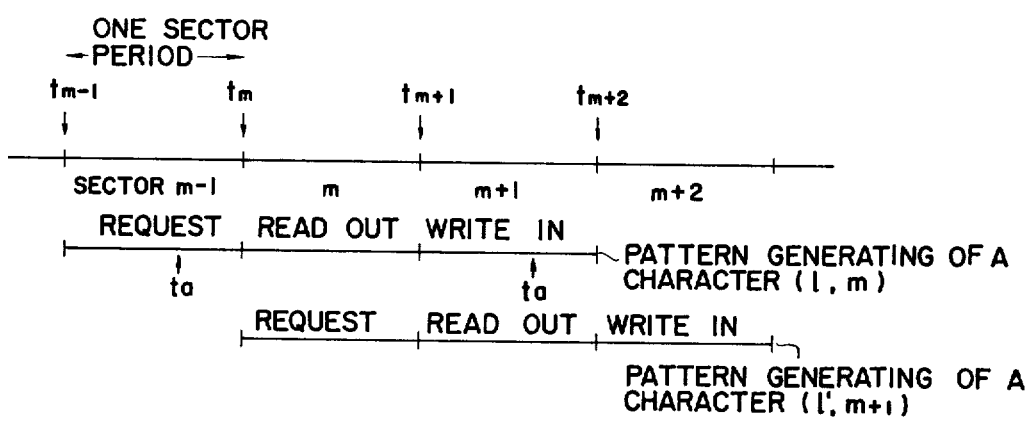
FIG. 13 is a time chart for explaining the operation of the construction in FIG. 12.

The operation of the character pattern generating apparatus in FIG. 12 will now be explained with reference to a time chart in FIG. 13. Taken as an example is a case where a character code (l, $m$) whose sector address corresponds to $m$ and whose track address corresponds to l exists in the character buffer memory 70.

(7.) The sector address $m$ preceding by one address is delivered as an output from the sector counter 32 at a time $t_{m-1}$, and it is held till a time $t_m$. On the other hand, the character buffer memory 70 circulates in a time interval of $t_{m-1} - t_m$. A sector address 51 of the sector address portion 34 of the character codes for $n$ characters is compared by the sector address comparator circuit 38 with a sector address 50 from the sector counter 32, i.e., with $m$. In the presence of coincidence, the sector address 51 and track address 52 of the particular character code from the buffer memories 34 and 35 are set in the sector register for coincidence 39 and the track register for coincidence 40 by a timing signal 60 at $t_m$, respectively. However, where an output signal 56 from the write completion-designating bit memory 36 is of the positive logic, the setting of the character code is not carried out.

2. By a timing signal 61 at $t_m$ provided each time the sector is renewed, the sector address of the register 39 and the track address of the register 40 are respectively set in the sector register for read-out 41 and the track register for read-out 42. The track address 53 of the track register for read-out 42 is supplied to the magnetic head selecting switch 33 in a time interval of $t_m - t_{m+1}$, and the track 1 is selected. In this way, a character pattern signal 54 recorded at the sector address $m$ and the track address 1 is loaded into the character pattern register for read-out 47 within the time interval of $t_m - t_{m+1}$. Thereafter, the character code and the corresponding character pattern are set from the reading-out sector register 41, the reading-out track register 42 and the reading-out character pattern register 47 into the writing sector register 43, the writing track register 44 and the writing character pattern register 45 by a timing signal 62 at $t_{m+1}$, respectively. Here, the reading-out registers 41, 42 and 47 and the writing registers 43, 44 and 45 are shift registers connected in series, respectively, and they can accumulate respectively different character codes and character patterns in sequence.

3. In a time interval of $t_{m+1} - t_{m+2}$, the character code of the character pattern set in the registers 43 and 44 are compared by the character code comparator circuit 46 with the character code of the character buffer memory 70. More specifically, the outputs of the writing sector register 43 and the writing track register 44 are sequentially compared with the sector address 51 and the track address 52 from the character buffer memory 70, respectively. In the case of coincidence, the character pattern recorded in the writing character pattern register 45 is written into the character pattern buffer memory 37 by a timing signal 63 at a time $t_a'$. Simultaneously therewith, a write completion bit memory 36 for indicating that the character pattern has been written is set.

4. The foregoing operations (1), (2) and (3) are executed for all the character codes of the character buffer memory 70 sequentially and in parallel at every sector period, whereby the required character patterns are acquired in the character buffer memory 70. Whether or not all the character patterns are obtained can be known by examining whether or not the write completion bit memory 36 is fully set. Thus, the character pattern for $n$ characters can be attained in the character buffer memory 70.

Here, in the construction of FIG. 12, the character buffer register 70 has been supposed to be the shift register. However, it is also possible to adopt a method in which a random access memory is used and the contents are sequentially selected. Although the character pattern signals of the writing character pattern register 45 may be delivered as outputs in parallel and set into the character pattern buffer memory 37 in parallel, they may also be divided into some groups and delivered as outputs and then set.

While, in the embodiment of FIG. 12, the buffer memories 34 and 35 of the shift register type have been used for the coincidence checks of the sector address and the track address, obviously it is also allowed to employ usual registers, to dispose comparator circuits in correspondence with the respective characters and to carry out the coincidence checks of $n$ characters in parallel at every sector period.

Although no illustration is included in FIG. 12, the judgment as to whether or not the coincidence checks for $n$ characters have been terminated is made as follows. A character number register which stores the number of characters recorded in the buffer memories 34 and 35 is provided, and a counter which counts the number of times of successful coincidence checks is provided. When both the numbers become coincident, it is determined that the retrieval of all the character patterns has been terminated, and the checking operation may be terminated. Although the register and the counter are not shown in FIG. 12, it is obvious that they can be easily incorporated. In this case, it is natural that where blanks etc. exist, the number of the blanks is not reflected in the character number register.

While the renewal of the sector counter may be executed independently of the information recording portion as illustrated in FIG. 12, the sector counter can naturally be renewed by an alternative method in which an information indicative of the termination of each character pattern is recorded at the tail of the character pattern and in which it is read out. With this measure, even when the length of the character pattern changes, that is, when the sector length changes in dependence on the place (however, equal between tracks), the sector counter need not be changed. This is encountered in a method in which, for example, the sector length is made short for English letters, numerals and "kana" (the Japanese alphabet) and long for Chinese characters.

As the character pattern memory, there can be used a circulating sequential memory other than a magnetic disc and a magnetic drum, for example, shift registers such as CCDs and BBDs or magnetic bubble memories which are respectively connected in parallel, and further, a hologram memory disc or a photographic disc.

As is set forth above, by employing the character pattern generating system according to this invention, a character displaying device or a printer having a capacity and a speed as required can be realized by combining a low-speed large-capacity memory and a high-speed small-capacity memory which are conventional. This is greatly effective especially in case where many kinds of characters exist as in a Chinese character display or a Chinese character printer.

Needless to say, this invention is applicable not only to character patterns such as Chinese characters, but also similarly to figure patterns.

What we claim is:

1. A character pattern generating system comprising
   a character pattern memory which is made up of a circulating sequential access memory and which stores therein patterns of plural types of characters and information for discriminating character codes corresponding to the character patterns,
   register means for temporarily storing a code and a pattern for each of the respective characters sequentially obtained from said character pattern memory,
   buffer memory means having stored therein the codes of a plurality of characters to be displayed for receiving and storing the character patterns corresponding to said character codes in the order of the display,
   coincidence means for comparing a character code stored in said register means with each of the respective character codes stored in said buffer memory means each time the character code from said character pattern memory is stored in said register means and for generating a coincidence output upon detecting coincidence therebetween, storage control means for causing the character pattern of said register means to be stored in said buffer memory means in response to a coincidence output of said coincidence means, and display means for displaying the character patterns of said buffer memory means when the character patterns corresponding to all of said character codes in said buffer memory means have been stored in said buffer memory means.

2. The character pattern generating system according to claim 1, wherein said buffer memory means is constructed of a circulating shift register.

3. The character pattern generating system according to claim 1, wherein said display means comprises a frame memory which stores said character patterns of said buffer memory means in the order of the display, and picture display means for displaying the storing contents of said frame memory.

4. The character pattern generating system according to claim 1, wherein said circulating sequential access memory which forms said character pattern memory stores the character pattern and character code-discriminating information over a plurality of tracks.

5. The character pattern generating system according to claim 1, wherein said coincidence means are disposed in correspondence with the respective character codes of said buffer memory means and compare said character code of said register means with said respective character codes of said buffer memory means at the same time.

6. The character pattern generating system according to claim 1, wherein said character pattern memory is constructed of a magnetic disc.

7. The character pattern generating system according to claim 4, further comprising means to selectively load the contents of predetermined characters into said register means, said contents of said predetermined characters being stored on predetermined tracks of said character pattern memory.

8. The character pattern generating system according to claim 4, wherein said circulating sequential access memory which constructs said character pattern memory stores the information therein in such a manner that said information corresponding to one character are divided into the respective tracks, and further comprising means for loading the contents of said respective tracks into said register means in parallel.

9. The character pattern generating system according to claim 1, wherein said character pattern memory is constructed of a plurality of circulating shift registers which are connected in parallel.

* * * * *